United States Patent
Cho et al.

(10) Patent No.: US 9,479,120 B2
(45) Date of Patent: Oct. 25, 2016

(54) FULLY DIFFERENTIAL SIGNAL SYSTEM INCLUDING COMMON MODE FEEDBACK CIRCUIT

(71) Applicant: Electronics and Telecommunications Research Institute, Daejeon (KR)

(72) Inventors: Young Kyun Cho, Daejeon (KR); Jae Ho Jung, Daejeon (KR); Kwangchun Lee, Daejeon (KR)

(73) Assignee: Electronics and Telecomunications Research Institute, Daejeon (KR)

( * ) Notice: Subject to any disclaimer, the term of this patent is extended or adjusted under 35 U.S.C. 154(b) by 0 days.

(21) Appl. No.: 14/612,801

(22) Filed: Feb. 3, 2015

(65) Prior Publication Data

US 2015/0229274 A1 Aug. 13, 2015

(30) Foreign Application Priority Data

Feb. 12, 2014 (KR) .......................... 10-2014-0016123

(51) Int. Cl.
*H03F 3/45* (2006.01)
*H03F 1/08* (2006.01)

(52) U.S. Cl.
CPC .......... *H03F 1/083* (2013.01); *H03F 3/45475* (2013.01); *H03F 3/45941* (2013.01); *H03F 2200/129* (2013.01); *H03F 2200/153* (2013.01); *H03F 2203/45114* (2013.01); *H03F 2203/45424* (2013.01); *H03F 2203/45521* (2013.01)

(58) Field of Classification Search
USPC .......................................... 330/259, 258, 85
See application file for complete search history.

(56) References Cited

U.S. PATENT DOCUMENTS

| 5,187,448 A * | 2/1993 | Brooks | H03F 3/45183 330/253 |
| 5,914,638 A * | 6/1999 | He | G11C 27/026 327/96 |
| 6,417,728 B1 * | 7/2002 | Baschirotto | H03F 3/45183 330/258 |
| 6,448,848 B1 | 9/2002 | Altmann | |

(Continued)

OTHER PUBLICATIONS

Banu, Mihai, et al., "Fully Differential Operational Amplifiers with Accurate Output Balancing," IEEE Journal of Solid-State Circuits, vol. 23, No. 6, Dec. 1988, pp. 1410-1414.

(Continued)

*Primary Examiner* — Patricia T Nguyen

(57) ABSTRACT

Provided is a fully differential signal system including a first amplification unit including first and second output terminals configured to output an output differential signal generated based on an input differential signal and a common mode feedback signal; a common mode detection unit configured to detect a common mode signal included in the output differential signal; a second amplification unit including a feedback signal output terminal configured to output the common mode feedback signal generated based on the detected common mode signal and a reference signal; a first stabilization unit connected between the first output terminal and the feedback signal output terminal; and a second stabilization unit connected between the second output terminal and the feedback signal output terminal. The fully differential signal system stably operates and an operation performance of the fully differential signal system is improved.

13 Claims, 16 Drawing Sheets

(56) References Cited

U.S. PATENT DOCUMENTS

| | | |
|---|---|---|
| 7,126,425 B2 | 10/2006 | Kimura |
| 7,834,696 B2 | 11/2010 | Giotta et al. |
| 2008/0048778 A1* | 2/2008 | Lee .................. H03F 1/08 330/253 |
| 2008/0284513 A1* | 11/2008 | Chang ............ H03F 3/45188 330/258 |
| 2009/0115516 A1 | 5/2009 | Park et al. |
| 2009/0115523 A1* | 5/2009 | Akizuki ........... H03F 3/45183 330/260 |
| 2014/0015550 A1* | 1/2014 | Nezuka ............. G01N 27/228 324/679 |
| 2014/0300415 A1* | 10/2014 | Casiraghi ........... G01P 15/0802 330/260 |

OTHER PUBLICATIONS

Kolm, R., et al., "Digital Programmable gmC-Filter in 120nm CMOS Technology," Proceedings from the International Conference of Mixed Design 2006, held at Gdynia, Poland, Jun. 22-24, 2006, pp. 281-284.

Yan, Weixun, et al., "Continuous-Time Common-Mode Feedback Circuit for Applications with Large Output Swing and High Output Impedance," Proceedings from the Design and Diagnostics of Electronic Circuits and Systems, held at Bratislava, Slovakia, Apr. 16-18, 2008 (5 pages, in English).

* cited by examiner

_FULLY DIFFERENTIAL SIGNAL SYSTEM INCLUDING COMMON MODE FEEDBACK CIRCUIT_

CROSS-REFERENCE TO RELATED APPLICATIONS

This U.S. non-provisional patent application claims priority under 35 U.S.C. §119 of Korean Patent Application No. 10-2014-0016123, filed on Feb. 12, 2014, the entire contents of which are hereby incorporated by reference.

BACKGROUND OF THE INVENTION

1. Technical Field

The inventive concepts disclosed herein relate to a fully differential signal system, and more particularly, to a fully differential signal system operating stably and having high performance with a common mode feedback circuit.

2. Description of the Related Art

A fully differential signal system is widely used for an integrated circuit design. When the fully differential signal system is used, an integrated circuit having a high power supply rejection ratio characteristic may be implemented. Moreover, even if noise occurs in a system on chip circuit, the fully differential signal system may transmit a proper signal without being affected from the noise. Furthermore, when the fully differential signal system is used, an even order harmonic distortion that degrades the accuracy of a signal may be reduced.

In general, the fully differential signal system includes a common mode feedback circuit. The common mode feedback circuit is used for constantly maintaining a DC operating point of the fully differential signal system. If the common mode feedback circuit is not included, especially, in a system operating at a low voltage, a DC operating point may leave a saturation region due to a mismatch between elements, a fluctuation in power supply, and a process error. That is, when the common mode feedback circuit is not included, the fully differential signal system may not operate appropriately. When the fully differential signal system includes the common mode feedback circuit, it may become insensitive to a mismatch between elements, a fluctuation in power supply, and a process error.

In order to constantly maintain a DC operating point of the fully differential signal system including the common mode feedback circuit, a DC gain of a system loop needs to be sufficiently large. In addition, in order to prevent the decrease of an operation speed of the fully differential signal system, a unity gain bandwidth of the fully differential signal system needs to be greater than a frequency of an input signal. That is, the unit gain bandwidth of the fully differential signal system needs to be sufficiently large. Additionally, a common mode feedback circuit which is capable of processing all signals included in a swing range of an output signal of the fully differential signal system needs to be designed. The above conditions may be satisfied by adjusting the gain and the bandwidth of an amplifier as well as a proper circuit design.

Furthermore, in order to properly operate the fully differential signal system including the common mode feedback circuit, loop compensation for a stable operation of a system needs to be performed. In addition, the performance of the fully differential signal system needs to be maintained when the common mode feedback circuit is connected. If the fully differential signal system operates unstably or its performance is deteriorated, this means that the fully differential signal system is not designed properly.

SUMMARY OF THE INVENTION

The inventive concept provides a fully differential signal system operating stably and having high performance with a common mode feedback circuit. In an embodiment of the inventive concept, in order to obtain the stability and high performance of a fully differential signal system, a stabilization unit may be connected to the fully differential signal system. As the stabilization unit is connected, a frequency at which the pole of the fully differential signal system is formed may be adjusted. Furthermore, as a zero is formed, the pole of the fully differential signal system may be compensated.

Embodiments of the inventive concept provide fully differential signal systems including a first amplification unit including first and second output terminals for outputting an output differential signal generated based on an input differential signal and a common mode feedback signal; a common mode detection unit for detecting a common mode signal included in the output differential signal; a second amplification unit including a feedback signal output terminal for outputting the common mode feedback signal generated based on the detected common mode signal and a reference signal; a first stabilization unit connected between the first output terminal and the feedback signal output terminal; and a second stabilization unit connected between the second output terminal and the feedback signal output terminal.

In some embodiments, the first amplification unit may be a feedforward compensation operational transconductance amplifier.

In other embodiments, the second amplification unit may be a single stage operational transconductance amplifier.

In still other embodiments, the first stabilization unit may be a first capacitor connected between the first output terminal and the feedback signal output terminal; and the second stabilization unit may be a second capacitor connected between the second output terminal and the feedback signal output terminal.

In even other embodiments, the first and second capacitors may have the same capacitance value.

In yet other embodiments, the first stabilization unit may include a first resistor and a first capacitor that are connected in series between the first output terminal and the feedback signal output terminal; and the second stabilization unit may include a second resistor and a second capacitor that are connected in series between the second output terminal and the feedback signal output terminal.

In further embodiments, the first and second resistors may have the same resistance value; and the first and second capacitors may have the same capacitance value.

In still further embodiments, according to the first and second capacitors, a value of a first frequency at which a first pole is formed may be controlled to be reduced and a value of a second frequency of which value is greater than the value of the first frequency and at which a second pole is formed may be controlled to be increased.

In even further embodiments, according to the first and second resistors, a zero may be controlled to be formed at a third frequency having a value greater than the value of the second frequency and the second pole may be controlled to be compensated by the formed zero.

In other embodiments of the inventive concept, fully differential signal systems include a first amplification unit including first and second output terminals for outputting an output differential signal generated based on an input differential signal and a common mode feedback signal; a common mode detection unit for detecting a common mode signal included in the output differential signal; a second amplification unit including a feedback signal output terminal for outputting the common mode feedback signal generated based on the detected common mode signal and a reference signal; a first stabilization unit including a first resistive unit and a first capacitive unit, wherein the first resistive unit and the first capacitive unit are connected in series, one end of the first resistive unit and one end of the first capacitive unit are connected to each other, the other end of the first resistive unit is connected to one of the first output terminal and the feedback signal output terminal, and the other end of the first capacitive unit is connected to one that is not connected to the other end of the first resistive unit from among the first output terminal and the feedback signal output terminal; and a second stabilization unit including a second resistive unit and a second capacitive unit, wherein the second resistive unit and the second capacitive unit are connected in series, one end of the second resistive unit and one end of the second capacitive unit are connected to each other, the other end of the second resistive unit is connected to one of the second output terminal and the feedback signal output terminal, and the other end of the second capacitive unit is connected to one that is not connected to the other end of the second resistive unit from among the second output terminal and the feedback signal output terminal.

In some embodiments, according to the first and second capacitive units, a value of a first frequency at which a first pole is formed may be controlled to be reduced and a value of a second frequency of which value is greater than the value of the first frequency and at which a second pole is formed may be controlled to be increased.

In other embodiments, according to the first and second resistive units, a zero may be controlled to be formed at a third frequency having a value greater than the value of the second frequency and the second pole may be controlled to be compensated by the formed zero.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF PREFERRED EMBODIMENTS

The above-described characteristics and the following detailed description are merely examples for helping the understanding of the inventive concept. That is, the inventive concept may be embodied in different forms and should not be constructed as limited to the embodiments set forth herein. The following embodiments are merely examples for completely disclosing the inventive concept and for delivering the inventive concept to those skilled in the art that the inventive concept belongs. Therefore, in the case where there are multiple methods for implementing the elements of the inventive concept, the inventive concept may be implemented with any of the methods or an equivalent thereof.

When it is mentioned that a certain configuration includes a specific element or a certain process includes a specific step, another element or another step may be further included. That is, the terms used herein are not for limiting the concept of the inventive concept, but for describing a specific embodiment. Furthermore, the embodiments described herein include complementary embodiments thereof.

The terms used herein have meanings that are generally understood by those skilled in the art. The commonly used terms should be consistently interpreted according to the context of the specification. Furthermore, the terms used herein should not be interpreted as overly ideal or formal meanings, unless the meanings of the terms are clearly defined. Hereinafter, the embodiments of the inventive concept will be described with reference to the accompanying drawings.

Figure 1:
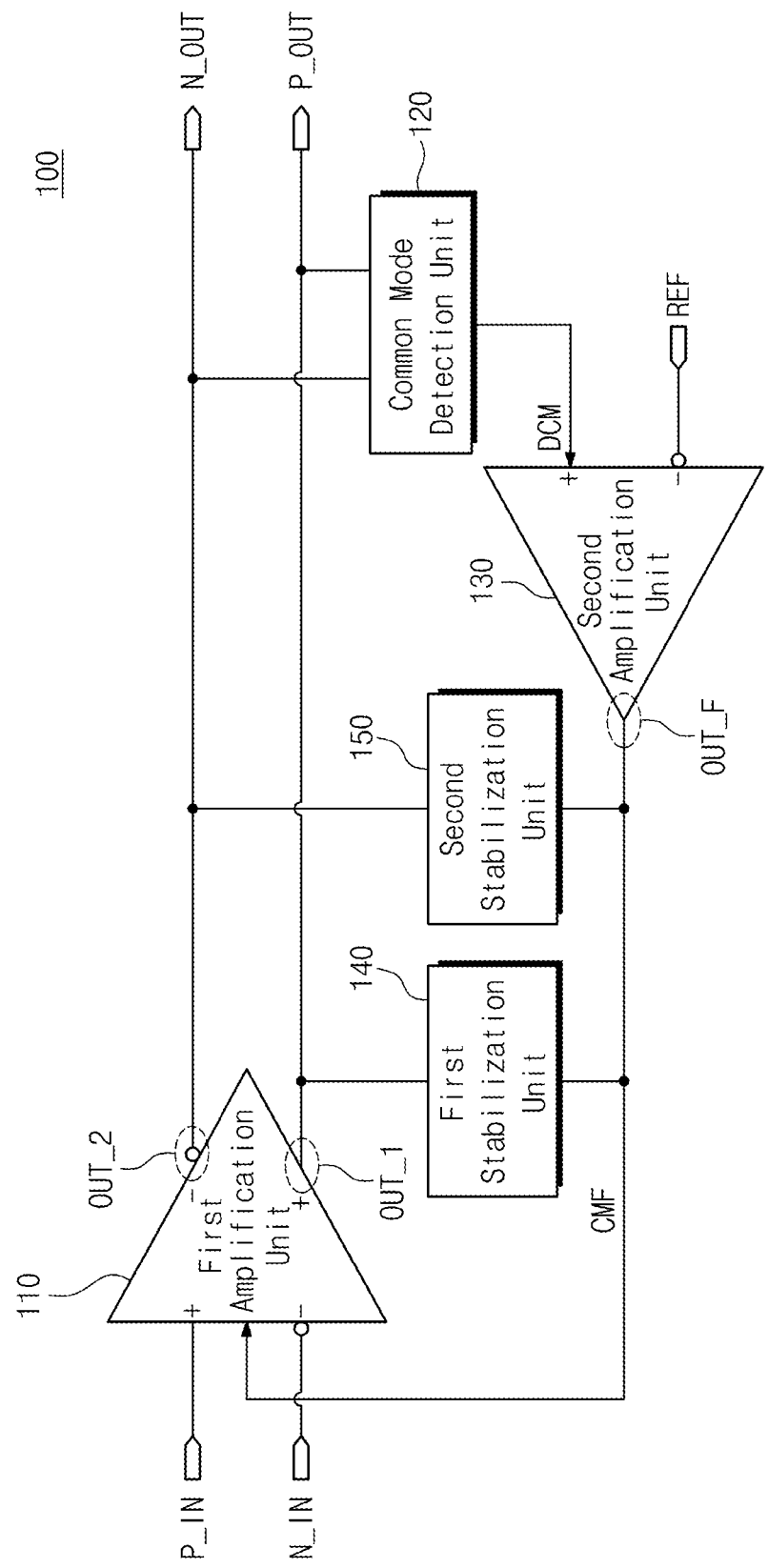
FIGS. 1 and 2 are block diagrams illustrating configurations of a fully differential signal system according to embodiments of the inventive concept.

FIG. 1 is a block diagram illustrating a configuration of a fully differential signal system according to an embodiment of the inventive concept. A fully differential signal system 100 includes a first amplification unit 110, a common mode detection unit 120, a second amplification unit 130, a first stabilization unit 140, and a second stabilization unit 150.

The first amplification unit 110 may receive an input differential signal P_IN and N_IN. Furthermore, the first amplification unit 110 may receive a common mode feedback signal CMF. The common mode feedback signal CMF is a signal for maintaining a DC operating point of the first amplification unit 110. The common mode feedback signal CMF may be provided from the second amplification unit 130. The operation of the second amplification unit 130 is described below. The first amplification unit 110 may generate an output differential signal P_OUT and N_OUT. The first amplification unit 110 may include a first output terminal OUT_1 and a second output terminal OUT_2 for outputting the output differential signal P_OUT and N_OUT, respectively. Therefore, the fully differential signal system 100 may transmit signals properly without significantly being affected by noise.

The common mode detection unit 120 may receive the output differential signal P_OUT and N_OUT. As an embodiment of the inventive concept, the common mode detection unit 120 may be connected to the first output terminal OUT_1 and the second output terminal OUT_2 of the first amplification unit 110. The common mode detection unit 120 may detect a common mode signal included in the output differential signal P_OUT and N_OUT. The common mode signal, for instance, may be noise included in power supply. The common mode detection unit 120 may generate the detected common mode signal DCM based on a detection result.

The second amplification unit 130 may receive the detected common mode signal DCM. Furthermore, the second amplification unit 130 may receive a reference signal REF. The second amplification unit 130 may generate the common mode feedback signal CMF based on the detected common mode signal DCM and the reference signal REF. For instance, the reference signal REF may be generated by a voltage generator, however, the inventive concept is not limited thereto. The second amplification unit 130 may include a feedback signal output terminal OUT_F for outputting the common mode feedback signal CMF. The common mode feedback signal CMF may be provided to the first amplification unit 110. When the fully differential signal system 100 includes a common mode feedback circuit formed by a loop along the common mode detection unit 120 and the second amplification unit 130, it may be insensitive to a mismatch between elements, a fluctuation of power supply, and a process error.

As an embodiment of the inventive concept, the first amplification unit 110 and the second amplification unit 130 may include an operational transconductance amplifier (OTA). As an embodiment of the inventive concept, the first amplification unit 110 may include a feedforward compensation OTA. As an embodiment of the inventive concept, the second amplification unit 130 may include a single stage OTA. However, the first amplification unit 110 and the second amplification unit 130 may include different kinds of amplifiers. That is, it is apparent that the inventive concept is not limited to the above embodiments.

The first stabilization unit 140 may be connected between the first output terminal OUT_1 of the first amplification unit 110 and the feedback signal output terminal OUT_F of the second amplification unit 130. The second stabilization unit 150 may be connected between the second output terminal OUT_2 of the first amplification unit 110 and the feedback signal output terminal OUT_F of the second amplification unit 130. In an embodiment of the inventive concept, according to the first stabilization unit 140 and the second stabilization unit 150, the fully differential signal system 100 may operate stably. In another embodiment of the inventive concept, according to the first stabilization unit 140 and the second stabilization unit 150, an operation performance of the fully differential signal system 100 may be improved while the fully differential signal system 100 stably operates.

Configurations of the first stabilization unit 140 and the second stabilization unit 150 may be described in detail with reference to FIGS. 2, 11, and 16. Then, effects obtained according to the first stabilization unit 140 and the second stabilization unit 150 are described in detail with reference to FIGS. 3 to 10 and 12 to 15.

Figure 2:
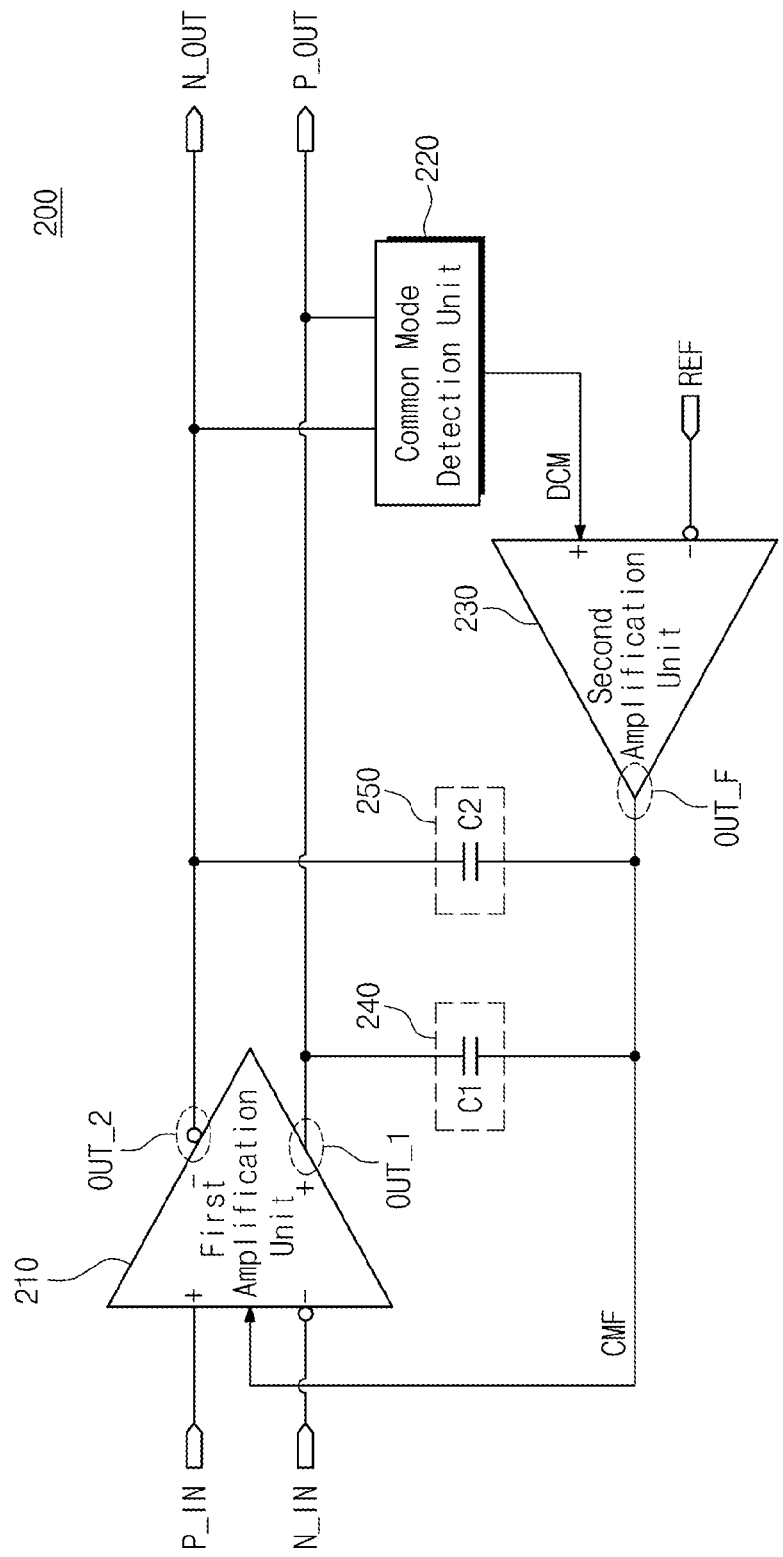

FIG. 2 is a block diagram illustrating a configuration of a fully differential signal system according to an embodiment of the inventive concept. A fully differential signal system 200 includes a first amplification unit 210, a common mode detection unit 220, a second amplification unit 230, a first stabilization unit 240, and a second stabilization unit 250. Configuration and functions of the first amplification unit 210, the common mode detection unit 220, the second amplification unit 230, the first stabilization unit 240, and the second stabilization unit 250 may include configurations and functions of the first amplification unit 110, the common mode detection unit 120, the second amplification unit 130, the first stabilization unit 140, and the second stabilization unit 150 of FIG. 1, respectively. In relation to FIG. 1, overlapping descriptions on the first amplification unit 210, the common mode detection unit 220, the second amplification unit 230, the first stabilization unit 240, and the second stabilization unit 250 are omitted.

As an embodiment of the inventive concept, the first stabilization unit 240 may include a first capacitor C1. The first capacitor C1 may be connected between a first output terminal OUT_1 of the first amplification unit 210 and a feedback signal output terminal OUT_F of the second amplification unit 230. As an embodiment of the inventive concept, the second stabilization unit 250 may include a second capacitor C2. The second capacitor C2 may be connected between a second output terminal OUT_2 of the first amplification unit 210 and the feedback signal output terminal OUT_F of the second amplification unit 230. In the above embodiment, the first capacitor C1 and the second capacitor C2 may have the same capacitance value.

The above embodiments are just examples for helping understanding the inventive concept, and the inventive concept is not limited thereto. That is, the first stabilization unit 240 and the second stabilization unit 250 may have different configurations. Effects obtained according to the above embodiments are described in detail with reference to FIGS. 3 to 10.

Graphs of FIGS. 3 to 10 and 12 to 15 are results obtained when the feedforward compensation OTA and the single state OTA are used as the first amplification unit 110 and the second amplification unit 130, respectively.

FIGS. 3 to 6 are graphs for illustrating an operation of a fully differential signal system when an embodiment of the inventive concept is not applied. That is, FIGS. 3 to 6 are graphs for illustrating an operation of a fully differential system 100 of FIG. 1 when a first stabilization unit 140 of FIG. 1 and a second stabilization unit 150 of FIG. 1 are not connected to the fully differential signal system 100.

Figure 3:
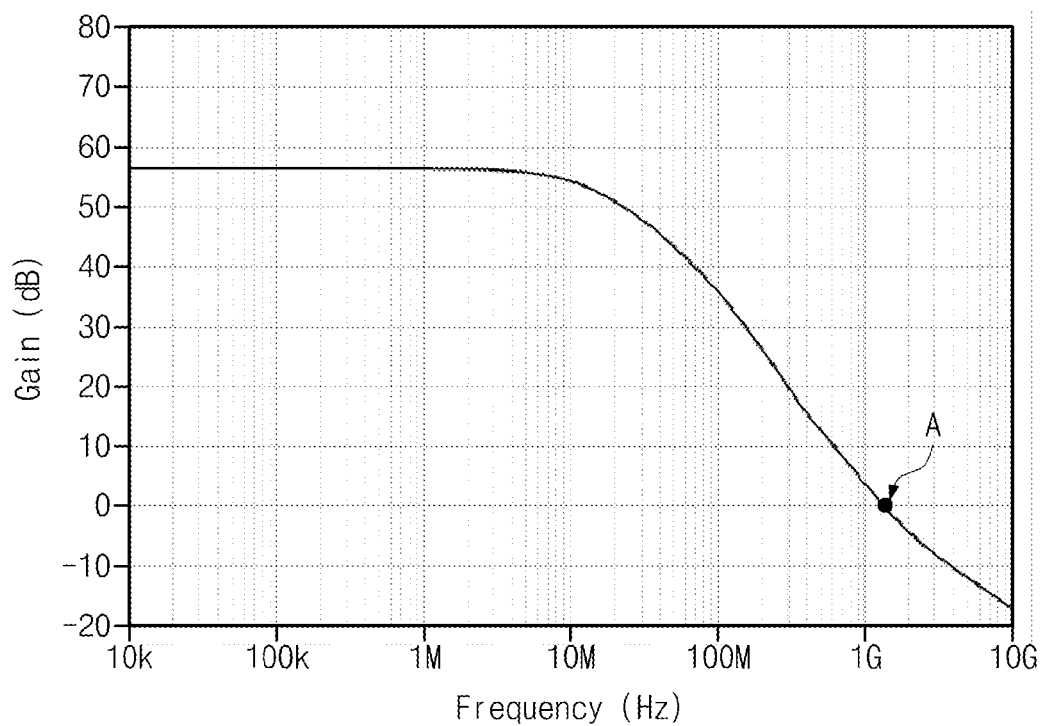
FIGS. 3 to 6 are graphs for illustrating an operation of a fully differential signal system when an embodiment of the inventive concept is not applied.

FIG. 3 is a graph for illustrating a gain characteristic of the first amplification unit 110 when the inventive concept is not applied. A value of a DC gain of the first amplification unit 110 is about 57.01 dB. A value of a unity gain bandwidth of the first amplification unit 110 is about 1.35 GHz (see the point A).

Figure 4:
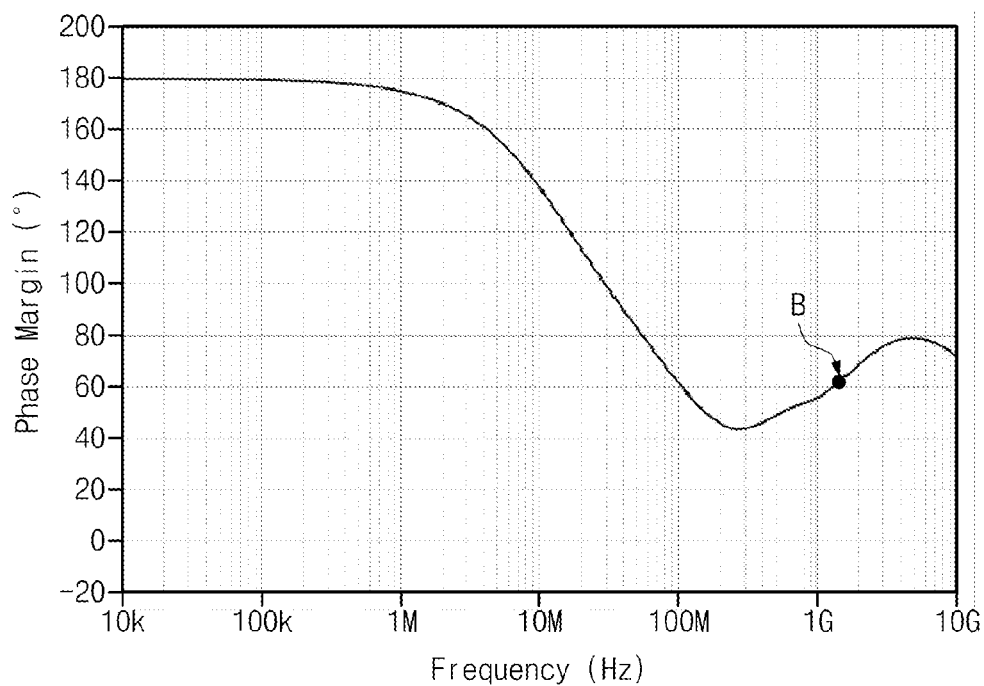

FIG. 4 is a graph for illustrating a phase margin characteristic of the first amplification unit 110 when the inventive concept is not applied. A value of a phase margin of the first amplification unit 110 is about 61.1° (see the point B). Since the value of the phase margin of the first amplification unit 110 is greater than 60°, the first amplification unit 110 may operate stably. That is, referring to FIGS. 3 and 4, the first amplification unit 110 may operate stably with a sufficient gain.

Figure 5:
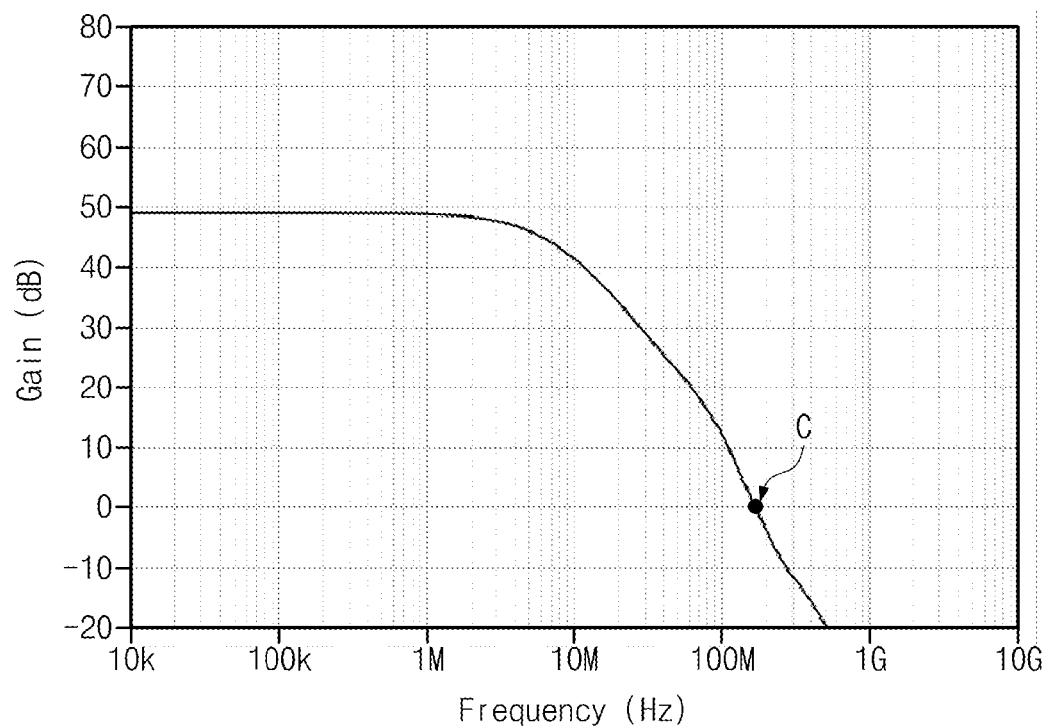

FIG. 5 is a graph for illustrating a gain characteristic of a system loop including the first amplification unit 110, a common mode detection unit 120 of FIG. 1, and a second amplification unit 130 of FIG. 1 when the inventive concept is not applied. A value of a DC gain of the system loop is about 49.0 dB. A value of a unity gain bandwidth of the system loop is about 167 MHz (see the point C).

Figure 6:
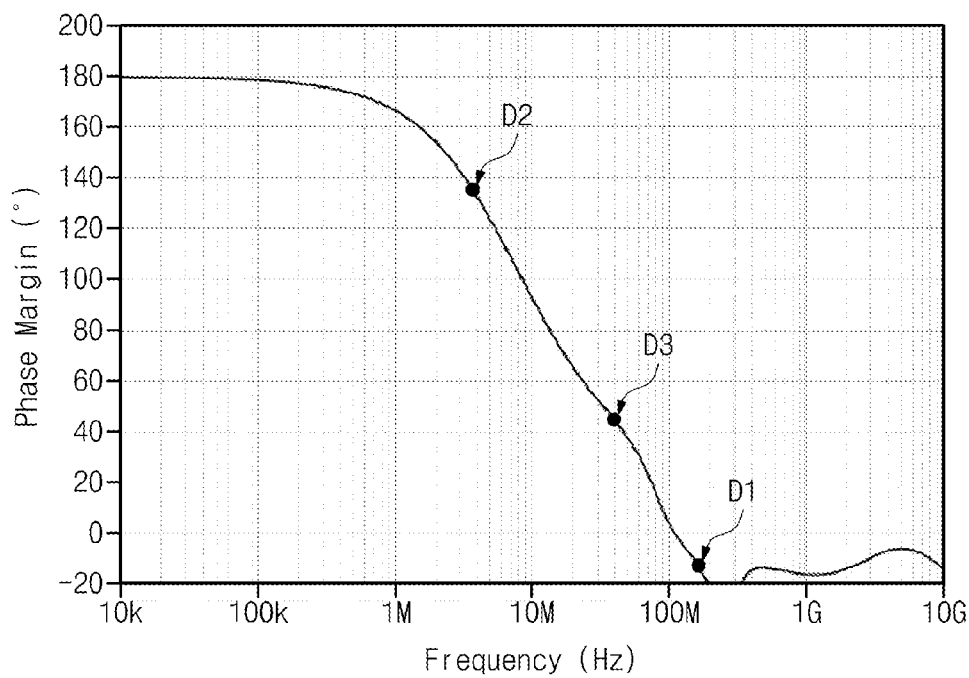

FIG. 6 is a graph for illustrating a phase margin characteristic of the system loop when the inventive concept is not applied. A value of a phase margin of the system loop is about −14.3° (see the point D1). Since the value of the phase margin of the system loop is negative, the fully differential signal system 100 may operate unstably. In this case, the fully differential signal system 100 may oscillate depending on an operation environment.

Referring to FIGS. 5 and 6, the fully differential signal system 100 has a sufficient gain, but its operation may be unstable. Accordingly, loop compensation for a stable operation of the fully differential signal system 100 needs to be performed. For a stable operation of the fully differential signal system 100, a method of increasing a value of a frequency at which a first pole (i.e., a point where a value of a phase margin is 135°, see the point D2) is formed and increasing a value of a frequency at which a second pole (i.e., a point where a value of a phase margin is 45°, see the point D3) is formed may be used. When this method is used, a value of a phase margin of a system loop may be increased. However, there is a physical limitation in realizing this method.

Accordingly, for a stable operation of the fully differential signal system 100, another method is needed. In an embodiment of the inventive concept, a method of decreasing the value of the frequency at which the first pole (see the point D2) is formed and increasing the value of the frequency at which the second pole (see the point D3) is formed is used. When this method is used, the value of the phase margin of the system loop may be increased and the fully differential signal system 100 may operate stably.

FIGS. 7 to 10 are graphs for illustrating effects obtained when a capacitor is connected to a fully differential signal system according to an embodiment of the inventive concept. That is, FIGS. 7 to 10 are graphs for illustrating an operation of a fully differential signal system 200 of FIG. 2.

Figure 7:
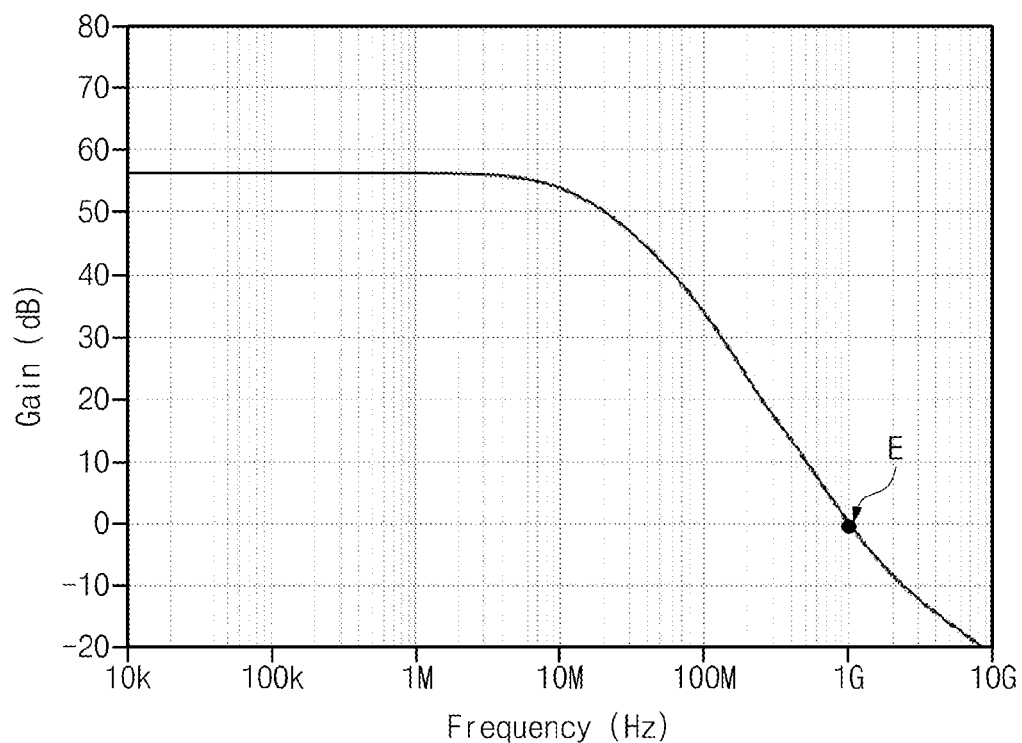
FIGS. 7 to 10 are graphs for illustrating an effect obtained when a capacitor is connected to a fully differential signal system according to an embodiment of the inventive concept.

FIG. 7 is a graph for illustrating a gain characteristic of a first amplification unit 210 of FIG. 2 in the fully differential signal system 200. A value of a DC gain of the first amplification unit 210 is about 57.1 dB. A value of a unity gain bandwidth of the first amplification unit 210 is about 0.991 GHz (see the point E).

Figure 8:
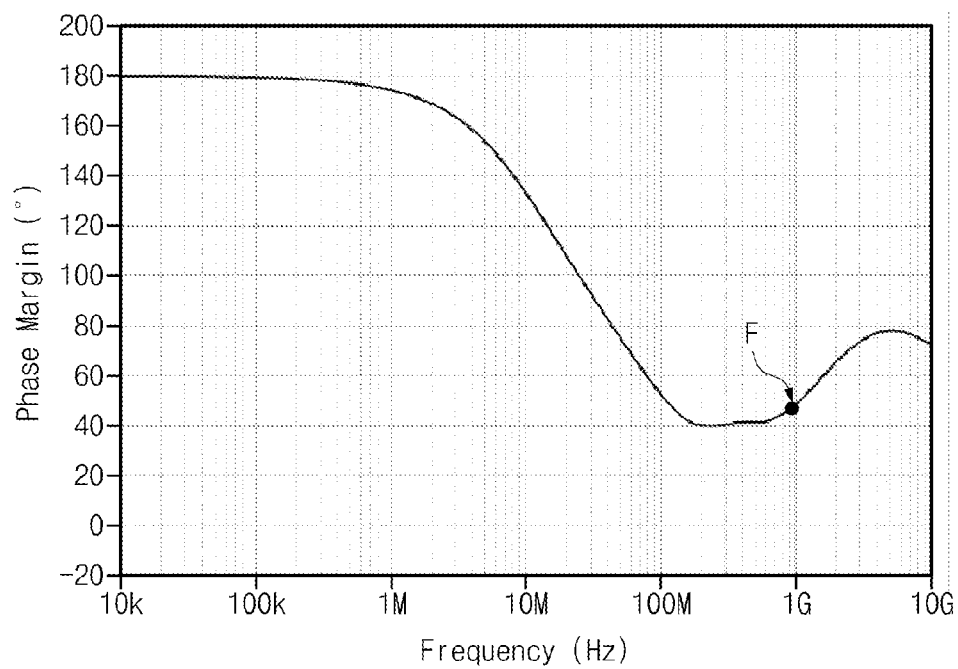

FIG. 8 is a graph for illustrating a phase margin characteristic of the first amplification unit 210 in the fully differential signal system 200. A value of a phase margin of the first amplification unit 210 is about 48.7° (see the point F). According to FIGS. 7 and 8, even when a capacitor is connected, a value of a DC gain of the first amplification unit 210 does not significantly change. However, a value of a unity gain bandwidth of the first amplification unit 210 is reduced by about 26%. Additionally, a value of a phase margin value of the first amplification unit 210 is reduced. That is, due to a connection of a capacitor, the performance of the first amplification unit 210 is somewhat deteriorated. This is because an effect as if the load of the first amplification unit 210 is increased by a connection of a capacitor occurs.

Figure 9:
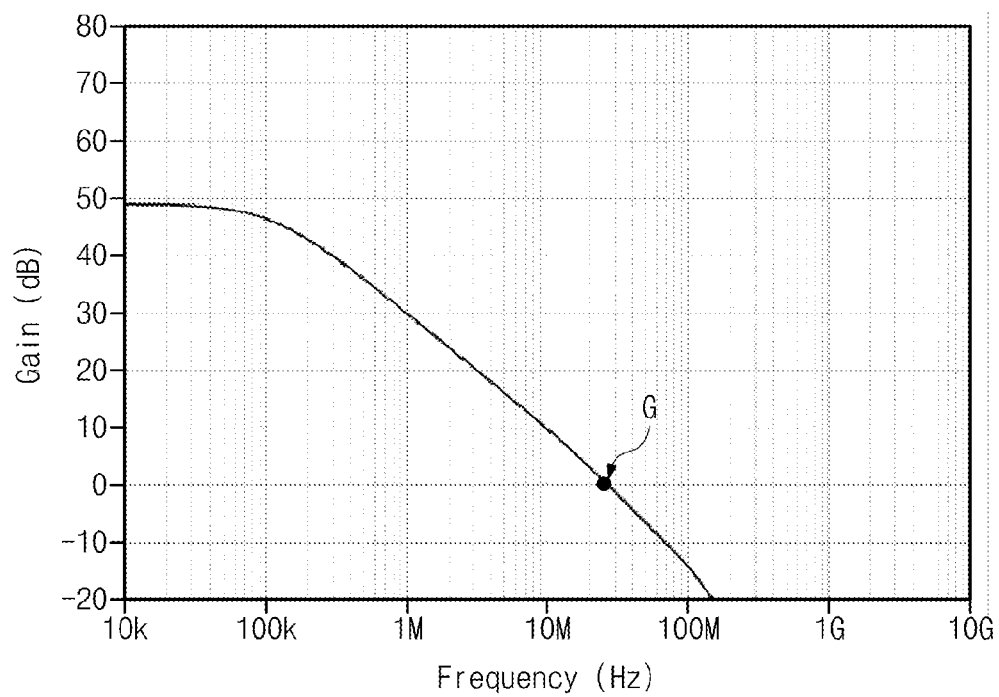

FIG. 9 is a graph for illustrating a gain characteristic of a system loop including the first amplification unit 210, a common mode detection unit 220 of FIG. 2, and a second amplification unit 230 of FIG. 2 in the fully differential signal system 200. A value of a DC gain of the system loop is about 49.0 dB. A value of a unity gain bandwidth of the system loop is about 26.7 MHz (see the point G).

Figure 10:
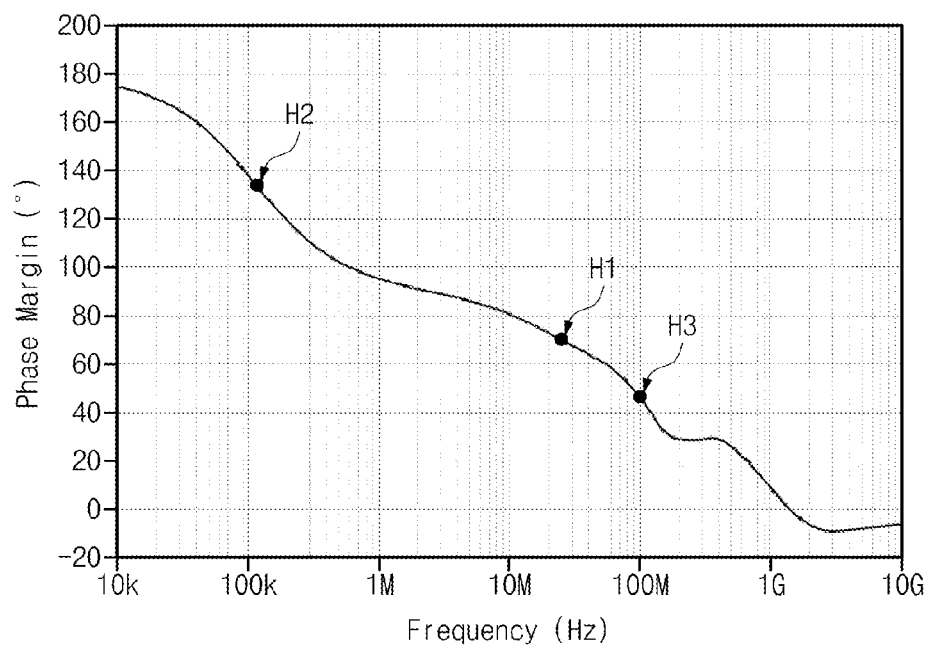

FIG. 10 is a graph for illustrating a phase margin characteristic of the system loop of the fully differential signal system 200. A value of a phase margin of the system loop is about 69.2° (see the point H1). Compared to the case that a capacitor is not connected (refer to FIG. 6), it is shown that a value of a phase margin of the system loop increases greatly. Since a phase margin of the system loop has a value greater than 60°, the fully differential signal system 200 may operate stably. This is because a value of a frequency at which the first pole is formed (see the point H2) is decreased and a value of a frequency at which the second pole is formed (see the point H3) is increased according to a connection of a capacitor. That is, loop compensation may be performed by a connection of a capacitor.

Referring to FIGS. 7 to 10, the fully differential signal system 200 including a capacitor may operate stably. However, a value of a unity gain bandwidth of the first amplification unit 210 is reduced by the connection of the capacitor. Due to this, the fully differential signal system 200 according to the embodiment of FIG. 2 may be utilized usefully when a frequency of an input signal is low. However, even though the fully differential signal system 200 according to the embodiment of FIG. 2 may operate stably, it may not be utilized usefully when a frequency of an input signal is high. Therefore, it is necessary to design a fully differential signal system operating stably with high performance.

Figure 11:
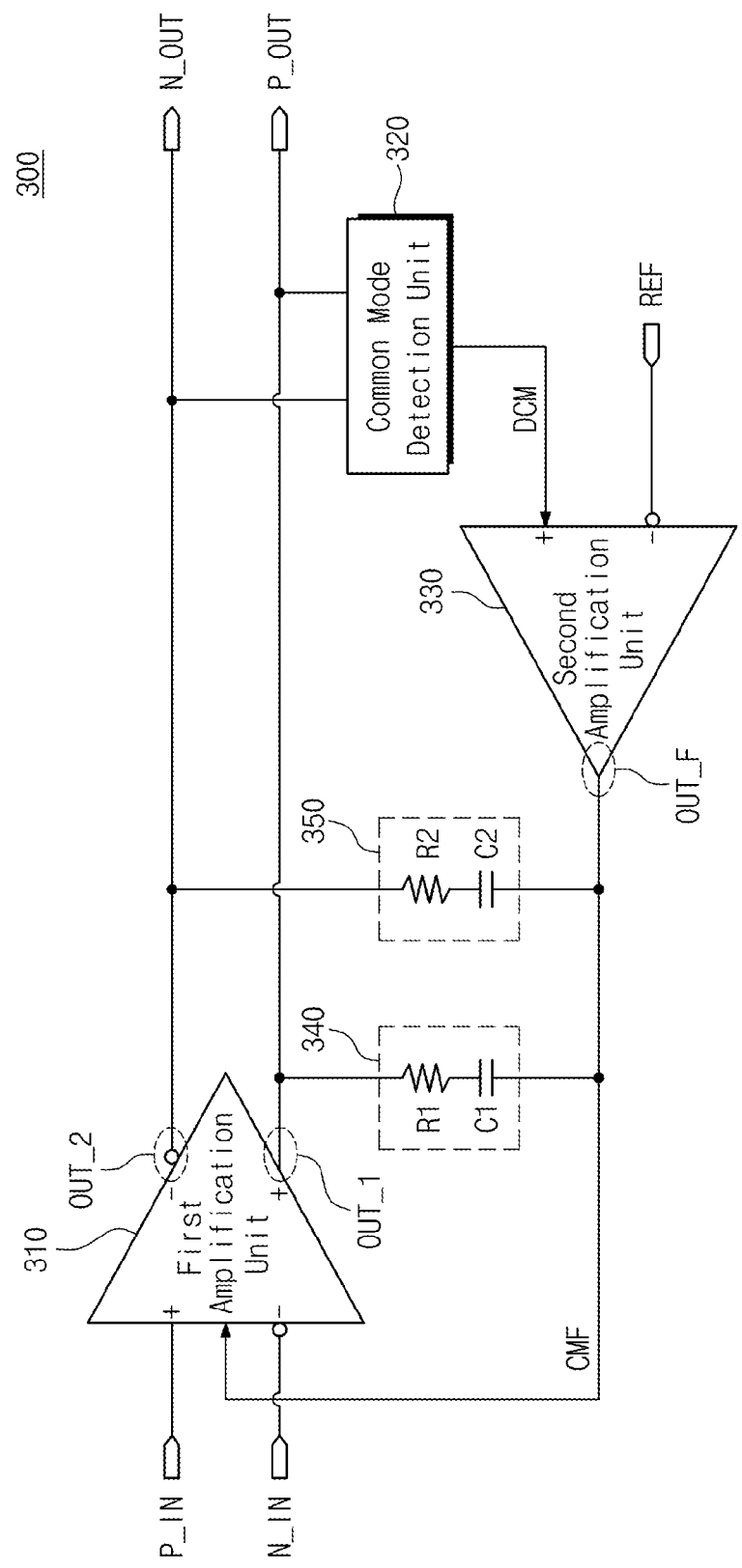
FIG. 11 is a block diagram illustrating a configuration of a fully differential signal system according to another embodiment of the inventive concept.

FIG. 11 is a block diagram illustrating a configuration of a fully differential signal system according to another embodiment of the inventive concept. A fully differential signal system 300 includes a first amplification unit 310, a common mode detection unit 320, a second amplification unit 330, a first stabilization unit 340, and a second stabilization unit 350. Configuration and functions of the first amplification unit 310, the common mode detection unit 320, the second amplification unit 330, the first stabilization unit 340, and the second stabilization unit 350 may include configurations and functions of the first amplification unit 110, the common mode detection unit 120, the second amplification unit 130, the first stabilization unit 140, and the second stabilization unit 150 of FIG. 1, respectively. In relation to FIG. 1, overlapping descriptions on the first amplification unit 310, the common mode detection unit 320, the second amplification unit 330, the first stabilization unit 340, and the second stabilization unit 350 are omitted.

As an embodiment of the inventive concept, the first stabilization unit 340 may include a first resistor R1 and a first capacitor C1. The first resistor R1 and the first capacitor C1 may be connected in series. The first resistor R1 and the first capacitor C1 may be connected between a first output terminal OUT_1 of the first amplification unit 310 and a feedback signal output terminal OUT_F of the second amplification unit 330. As an embodiment of the inventive concept, the second stabilization unit 350 may include a second resistor R2 and a second capacitor C2. The second resistor R2 and the second capacitor C2 may be connected in series. The second resistor R2 and the second capacitor C2 may be connected between a second output terminal OUT_2 of the first amplification unit 310 and the feedback signal output terminal OUT_F of the second amplification unit 330. In the above embodiments, the first resistor R1 and the second resistor R2 may have the same resistance value. Also, the first capacitor C1 and the second capacitor may have the same capacitance value.

The above embodiments are just examples for helping understanding the inventive concept, and the inventive concept is not limited thereto. That is, the first stabilization unit 340 and the second stabilization unit 350 may have different configurations. For example, the position of the first resistor R1 and the position of the first capacitor C1 may be interchangeable. Additionally, the position of the second resistor R2 and the position of the second capacitor C2 may be interchangeable. That is, it is enough that the first stabilization unit 340 includes a serial connection of the first resistor R1 and the first capacitor C1. Additionally, it is enough that the second stabilization unit 350 includes a serial connection of the second resistor R2 and the second capacitor C2.

Effects obtained according to the above embodiments are described in detail with reference to FIGS. 12 to 15. However, effects obtained by a connection of the first capacitor C1 and the second capacitor C2 are same as that described with reference to FIGS. 7 to 10. Accordingly, effects obtained by a connection of the first resistor R1 and the second resistor R2 are further described.

FIGS. 12 to 15 are graphs for illustrating effects obtained when a capacitor and a resistor are connected to a fully differential signal system according to an embodiment of the inventive concept. That is, FIGS. 12 to 15 are graphs for illustrating an operation of a fully differential signal system 300 of FIG. 11.

Figure 12:
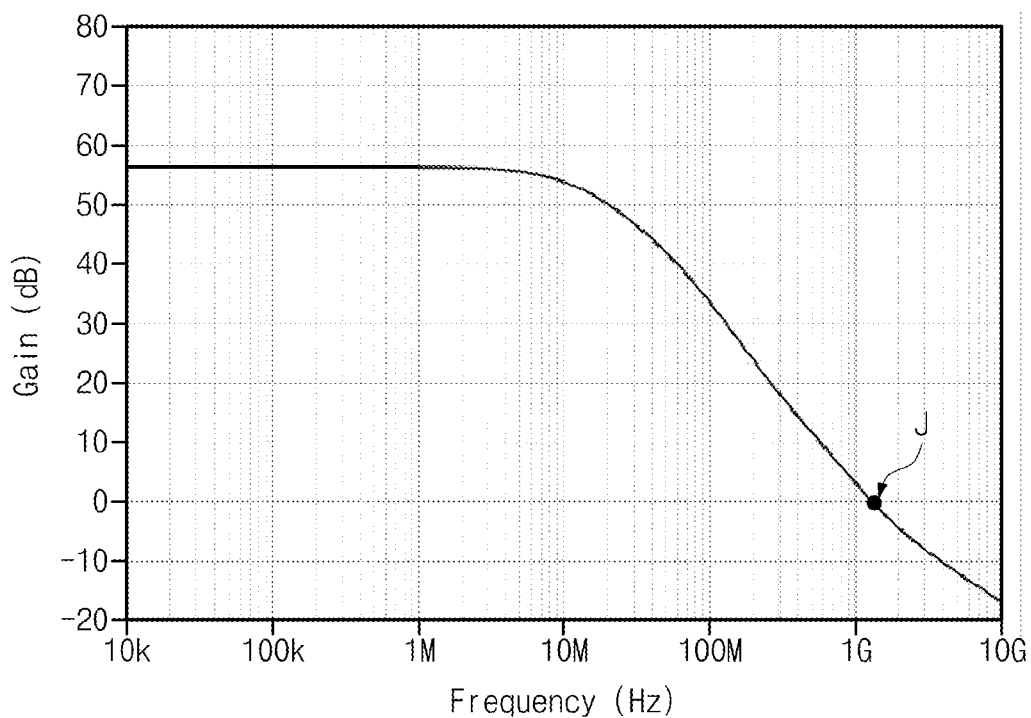
FIGS. 12 to 15 are graphs for illustrating an effect obtained when a capacitor and a resistor are connected to a fully differential signal system according to an embodiment of the inventive concept.

FIG. 12 is a graph for illustrating a gain characteristic of a first amplification unit 310 of FIG. 11 in the fully differential signal system 300. A value of a DC gain of the first amplification unit 310 is about 57.01 dB. A value of a unity gain bandwidth of the first amplification unit 310 is about 1.32 GHz (see the point J).

Figure 13:
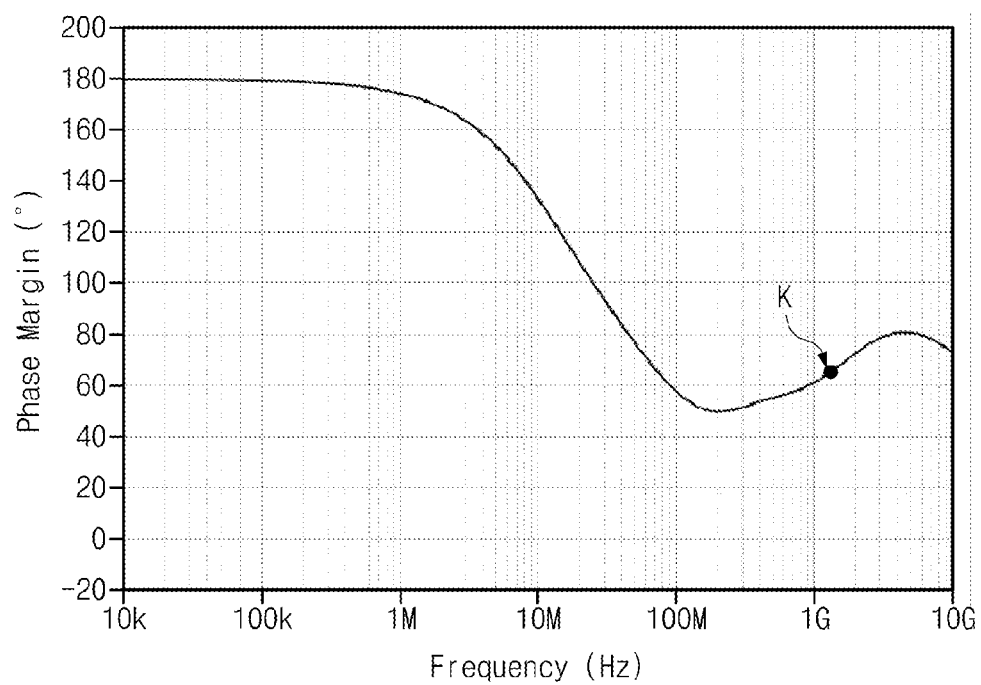

FIG. 13 is a graph for illustrating a phase margin characteristic of the first amplification unit 310. A value of a phase margin of the first amplification unit 310 is about 65.0° (see the point K). In FIGS. 12 and 13, it is shown that a value of a unity gain bandwidth of the first amplification unit 310 is increased again by an additional connection of a resistor. Additionally, it is shown that a value of a phase margin of the first amplification unit 310 is increased again. That is, as a resistor is connected additionally, the performance of the first amplification unit 310 is not deteriorated. This is because an effect as if the load of the first amplification unit 310 is increased by a connection of a capacitor is compensated by an additional connection of a resistor. Rather, the performance and stability of the first amplification unit 310 is further improved when a capacitor and a resistor are connected as compared to when they are not connected to a fully differential signal system.

Figure 14:
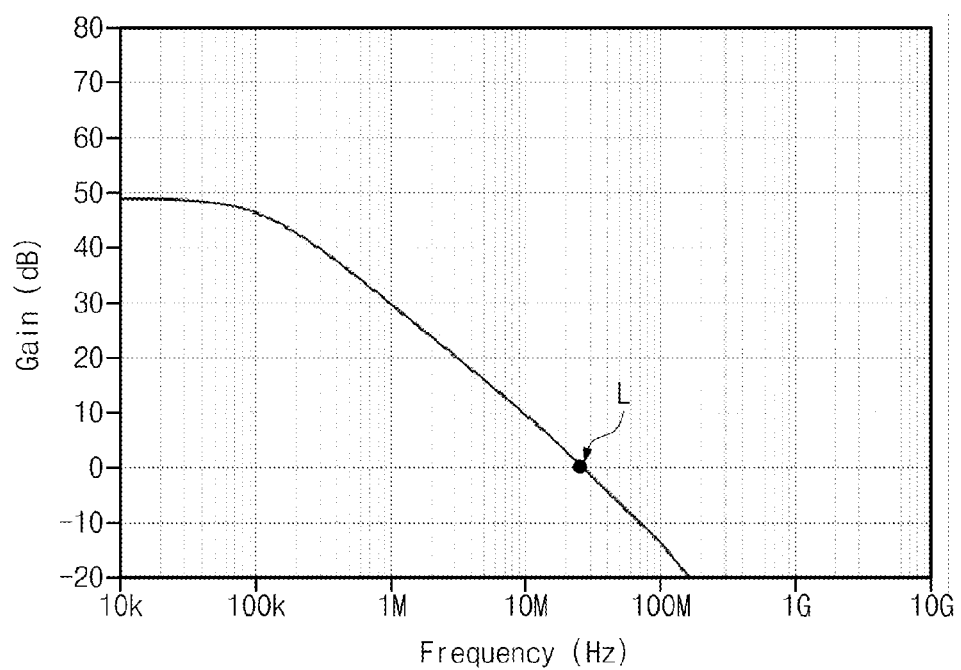

FIG. 14 is a graph for illustrating a gain characteristic of a system loop including the first amplification unit 310, a common mode detection unit 320 of FIG. 11, and a second amplification unit 330 of FIG. 11 in the fully differential signal system 300. A value of a DC gain of the system loop is about 49.0 dB. A value of a unity gain bandwidth of the system loop is about 26.6 MHz (see the point L).

Figure 15:
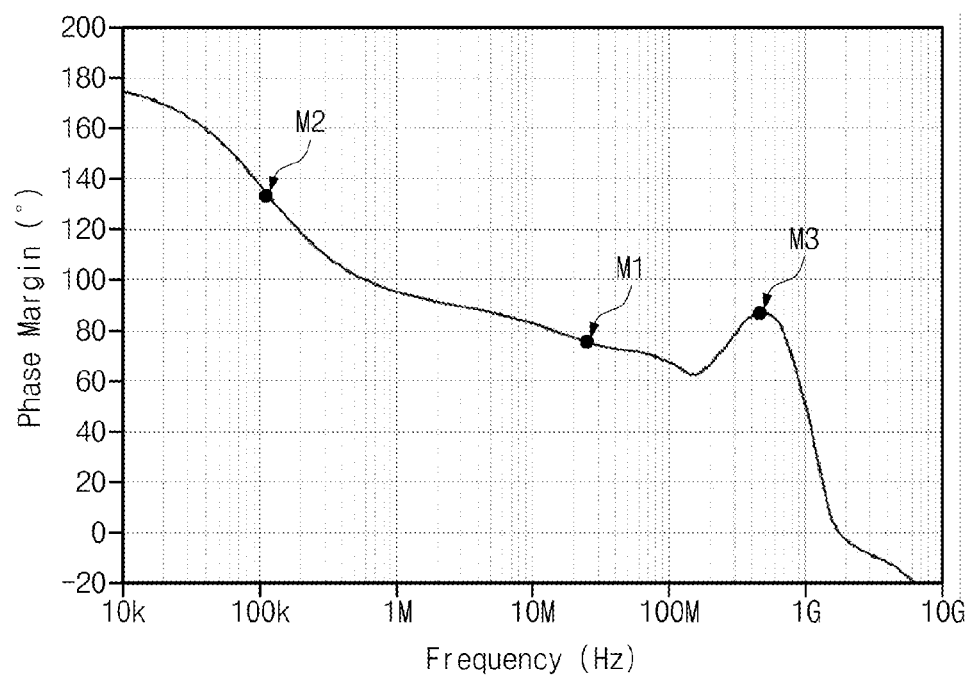

FIG. 15 is a graph for illustrating a phase margin characteristic of the system loop. A value of a phase margin of the system loop is about 76.0° (see the point MD. As compared to the case that a capacitor and a resistor are not connected, it is shown that a value of a phase margin of the system loop is significantly increased. That is, the fully differential signal system 300 may operate stably. This is because a value of a frequency at which the first pole (see the point M2) is formed is decreased and a value of a frequency at which the second pole is formed is increased.

Furthermore, as compared to the case that only a capacitor is connected, it is shown that a value of a phase margin of the system loop is further increased. This is because as a resistor is connected additionally, a zero (i.e., a point where a value of a phase margin is 90°, see the point M3) is formed at a frequency having a value greater than a value of a frequency at which the second pole is formed. Since the second pole is compensated by the formed zero, a value of a phase margin of the system loop may be further increased.

Referring to FIGS. 12 to 15, the fully differential signal system 300 including a capacitor and a resistor may operate stably. Furthermore, according to the additional connection of a resistor, the characteristic of the system loop and the first amplification unit 310 may be improved. Accordingly, the fully differential signal system 300 of FIG. 11 may be utilized usefully even when a frequency of an input signal is high.

The characteristic values mentioned with reference to FIGS. 2 to 15 are summarized in the following Table 1.

TABLE 1

| | The inventive concept is not applied | Only a capacitor is connected according to the inventive concept | A capacitor and a resistor are connected according to the inventive concept |
|---|---|---|---|
| DC gain of first amplification unit (dB) | 57.01 | 57.01 | 57.01 |
| Unity gain bandwidth of first amplification unit (GHz) | 1.35 | 0.991 | 1.32 |
| Phase margin of first amplification unit (°) | 61.1 | 48.7 | 65.0 |
| DC gain of system loop (dB) | 49.0 | 49.0 | 49.0 |
| Phase margin of system loop (°) | −14.3 | 69.2 | 76.0 |

When the inventive concept is not applied, a phase margin of a system loop of a fully differential signal system has a negative value. Accordingly, the fully differential signal system may oscillate during an operation. For a stable operation of the fully differential signal system, a stabilization unit may be connected according to an embodiment of the inventive concept.

In particular, when only a capacitor is connected as a stabilization unit, a value of a phase margin of a system loop is increased so that a fully differential signal system may operate stably. However, a value of a unity gain bandwidth of a first amplification unit may be reduced. Accordingly, a fully differential signal system including only a capacitor may be utilized usefully when a frequency of an input signal is low.

On the other hand, when a capacitor and a resistor are connected in series as a stabilization unit, a value of a unity gain bandwidth of a first amplification unit may be increased again. Additionally, the stability of a system loop may be further improved. A fully differential signal system including a serial connection of a capacitor and a resistor may be utilized usefully even when a frequency of an input signal is high.

The above description is an example for helping understanding the inventive concept, and it is apparent that the inventive concept is not limited thereto. Each component may be implemented in another configuration or implemented to include another circuit by those skilled in the art. In a fully differential signal system having a modified configuration, characteristic values different from those in the above descriptions may be obtained. However, the fully differential signal system having the modified configuration may also show effects according to the inventive concept. That is, according to the inventive concept, a fully differential signal system operating stably with improved performance may be obtained.

Figure 16:
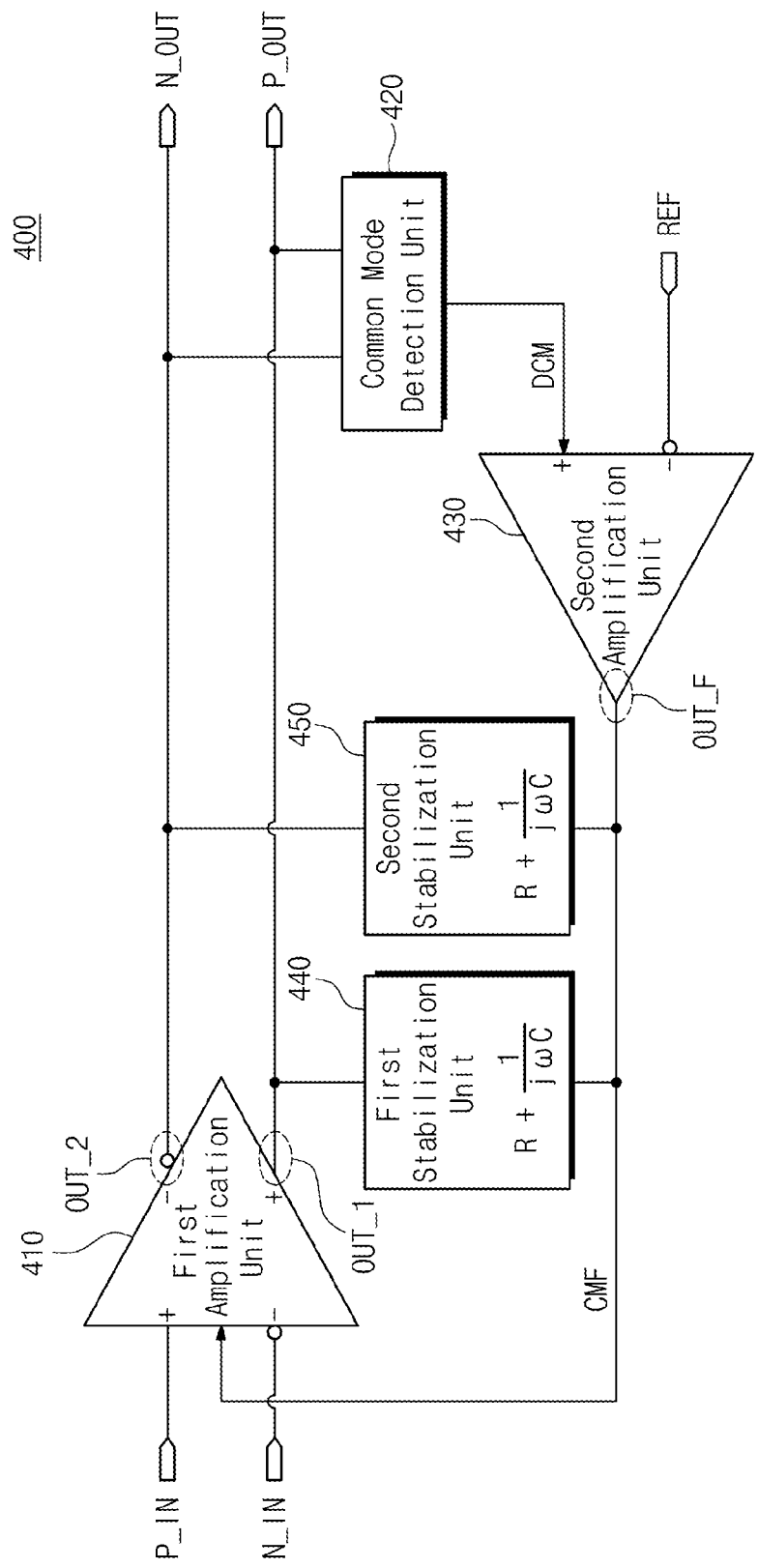
FIG. 16 is a block diagram illustrating a configuration of a fully differential signal system according to another embodiment of the inventive concept.

FIG. 16 is a block diagram illustrating a configuration of a fully differential signal system according to another embodiment of the inventive concept. A fully differential signal system 400 includes a first amplification unit 410, a common mode detection unit 420, a second amplification unit 430, a first stabilization unit 440, and a second stabilization unit 450.

The first amplification unit 410 may receive an input differential signal P_IN and N_IN. Furthermore, the first amplification unit 410 may receive a common mode feedback signal CMF. The common mode feedback signal CMF is a signal for maintaining a DC operating point of the first amplification unit 410. The common mode feedback signal CMF may be provided from the second amplification unit 430. Functions of the second amplification unit 430 are described later. The first amplification unit 410 may generate an output differential signal P_OUT and N_OUT. The first amplification unit 410 may include a first output terminal OUT_and a second output terminal OUT_2 for outputting the output differential signal P_OUT and N_OUT, respectively. Therefore, the fully differential signal system 400 may transmit signals properly without significantly being affected by noise.

The common mode detection unit 420 may receive the output differential signal P_OUT and N_OUT. As an embodiment of the inventive concept, the common mode detection unit 420 may be connected to the first output terminal OUT_1 and the second output terminal OUT_2 of the first amplification unit 410. The common mode detection unit 420 may detect a common mode signal included in the output differential signal P_OUT and N_OUT. The common mode signal, for instance, may be noise included in power supply. The common mode detection unit 420 may generate the detected common mode signal DCM based on a detection result.

The second amplification unit 430 may receive the detected common mode signal DCM. Furthermore, the second amplification unit 430 may receive a reference signal REF. The second amplification unit 430 may generate the common mode feedback signal CMF based on the detected common mode signal DCM and the reference signal REF. The second amplification unit 430 may include a feedback signal output terminal OUT_F for outputting the common mode feedback signal CMF. The common mode feedback signal CMF may be provided to the first amplification unit 410. When the fully differential signal system 400 includes a common mode feedback circuit formed by a loop along the common mode detection unit 420 and the second amplification unit 430, it may be insensitive to a mismatch between elements, a fluctuation of power supply, and a process error.

The first stabilization unit 440 may be connected between the first output terminal OUT_1 of the first amplification unit 410 and the feedback signal output terminal OUT_F of the second amplification unit 430. The first stabilization unit 440 may include a first resistive unit and a first capacitive unit. The first resistive unit and the first capacitive unit may be connected in series. That is, the first stabilization unit 440 may be configured to have the characteristic of the following Equation 1 in a frequency domain.

$$R + \frac{1}{j\omega C} \qquad \text{[Equation 1]}$$

(where R is a resistance value, C is a capacitance value, and ω is a frequency value)

As an embodiment of the inventive concept, the first resistive unit and the first capacitive unit in the first stabilization unit 440 may be one resistive element and one capacitive element, respectively. However, the inventive concept is not limited to the above embodiment. Each of the first resistive unit and the first capacitive unit may be implemented with any device or any circuit having a resistance component and a capacitance component. Alternatively, if one device or one circuit has a resistance component and a capacitance component simultaneously, the first stabilization unit 440 may include only the one device or the one circuit.

As an embodiment, in the first stabilization unit 440, one end of the first resistive unit and one end of the first capacitive unit may be connected to each other. The other end of the first resistive unit may be connected to one of the first output terminal OUT_1 and the feedback signal output terminal OUT_F. The other end of the first capacitive unit may be connected to one that is not connected to the other end of the first resistive unit from among the first output terminal OUT_1 and the feedback signal output terminal OUT_F. That is, it is enough that the first stabilization unit 440 includes a serial connection of the first resistive unit and the first capacitive unit. Therefore, the first stabilization unit 440 may have the characteristic of Equation 1 in a frequency domain.

The second stabilization unit 450 may be connected between the second output terminal OUT_2 of the first amplification unit 410 and the feedback signal output terminal OUT_F of the second amplification unit 430. The second stabilization unit 450 may include a second resistive unit and a second capacitive unit. The second resistive unit and the second capacitive unit may be connected in series. That is, the second stabilization unit 450 also may be configured to have the characteristic of Equation 1 in a frequency domain.

As an embodiment of the inventive concept, the second resistive unit and the second capacitive unit included in the second stabilization unit 450 may be one resistive element and one capacitive element, respectively. However, the inventive concept is not limited to the above embodiment. Each of the second resistive unit and the second capacitive unit may be implemented with any device or any circuit having a resistance component and a capacitance component. Alternatively, if one device or one circuit has a resistance component and a capacitance component simultaneously, the second stabilization unit 450 may include only the one device or the one circuit.

In the second stabilization unit 450, one end of the second resistive unit and one end of the second capacitive unit may be connected to each other. The other end of the second resistive unit may be connected to one of the second output terminal OUT_2 and the feedback signal output terminal OUT_F. The other end of the second capacitive unit may be connected to one that is not connected to the other end of the second resistive unit from among the second output terminal OUT_2 and the feedback signal output terminal OUT_F. That is, it is enough that the second stabilization unit 450 includes a serial connection of the second resistive unit and the second capacitive unit. Therefore, the second stabilization unit 450 may have the characteristic of Equation 1 in a frequency domain.

According to the first capacitive unit and the second capacitive unit, a value of a first frequency at which the first pole of the fully differential signal system 400 is formed may be reduced. Furthermore, according to the first capacitive unit and the second capacitive unit, a value of a second frequency of which value is greater than the value of the first frequency and at which the second pole is formed may be increased. Therefore, the fully differential signal system 400 may operate stably.

According to the first resistive unit and the second resistive unit, a zero may be formed at a third frequency that has a value greater than the value of the second frequency.

According to the formed zero, the second pole may be compensated. Therefore, the characteristic of the first stabilization unit 440 and the second stabilization unit 450 may be improved. That is, according to the first stabilization unit 440 and the second stabilization unit 450, the fully differential signal system 400 operating stably with improved performance may be obtained. Effects obtained by the connection of the first stabilization unit 440 and the second stabilization unit 450 is described above with reference to FIGS. 3 to 10 and FIGS. 12 to 15. Furthermore, the above-mentioned effects may be obtained with the connection of the first stabilization unit 440 and the second stabilization unit 450 having a simple configuration, without a complex circuit or high power consumption.

According to an embodiment of the inventive concept, a fully differential signal system may operate stably. According to another embodiment of the inventive concept, an operation performance of a fully differential signal system may be improved while the fully differential signal system stably operates.

Device components illustrated in each block diagram are provided for better understanding of the inventive concept. Each block may be formed of smaller blocks according to functionality. Or, a plurality of blocks may constitute a larger block according to functionality. That is, the inventive concept is not limited to components illustrated in each block diagram.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A fully differential signal system comprising:
   a first amplification unit comprising first and second output terminals configured to output first and second components of an output differential signal generated based on an input differential signal and a common mode feedback signal;
   a common mode detection unit configured to detect a common mode signal included in the output differential based on the output of both the first component and the second component of the output differential signal;
   a second amplification unit comprising a feedback signal output terminal configured to output the common mode feedback signal generated based on the detected common mode signal and a reference signal;
   a first stabilization unit connected between the first output terminal and the feedback signal output terminal; and
   a second stabilization unit connected between the second output terminal and the feedback signal output terminal.

2. The fully differential signal system of claim 1, wherein the first amplification unit is a feedforward compensation operational transconductance amplifier.

3. The fully differential signal system of claim 1, wherein the second amplification unit is a single stage operational transconductance amplifier.

4. The fully differential signal system of claim 1, wherein the first stabilization unit is a first capacitor connected between the first output terminal and the feedback signal output terminal, and
   the second stabilization unit is a second capacitor connected between the second output terminal and the feedback signal output terminal.

5. The fully differential signal system of claim 4, wherein the first and second capacitors have a same capacitance value.

6. The fully differential signal system of claim 1, wherein the first stabilization unit comprises a first resistor and a first capacitor that are connected in series between the first output terminal and the feedback signal output terminal, and
   the second stabilization unit comprises a second resistor and a second capacitor that are connected in series between the second output terminal and the feedback signal output terminal.

7. The fully differential signal system of claim 6, wherein the first and second resistors have a same resistance value, and
   the first and second capacitors have a same capacitance value.

8. The fully differential signal system of claim 6, wherein the first and second capacitors are configured to reduce a value of a first frequency at which a first pole is formed and to increase a value of a second frequency, which is greater than the value of the first frequency, at which a second pole is formed.

9. The fully differential signal system of claim 8, wherein the first and second resistors are configured to compensate the second pole by forming a zero at a third frequency, which is greater than the value of the second frequency.

10. A fully differential signal system comprising:
    a first amplification unit comprising first and second output terminals configured to output an output differential signal generated based on an input differential signal and a common mode feedback signal;
    a common mode detection unit configured to detect a common mode signal included in the output differential signal;
    a second amplification unit comprising a feedback signal output terminal configured to output the common mode feedback signal generated based on the detected common mode signal and a reference signal;
    a first stabilization unit comprising a first resistive unit and a first capacitive unit, wherein the first resistive unit and the first capacitive unit are connected in series, one end of the first resistive unit and one end of the first capacitive unit are connected to each other, an other end of the first resistive unit is connected to one of the first output terminal and the feedback signal output terminal, and an other end of the first capacitive unit is connected to one that is not connected to the other end of the first resistive unit from among the first output terminal and the feedback signal output terminal; and
    a second stabilization unit comprising a second resistive unit and a second capacitive unit, wherein the second resistive unit and the second capacitive unit are connected in series, one end of the second resistive unit and one end of the second capacitive unit are connected to each other, an other end of the second resistive unit is connected to one of the second output terminal and the feedback signal output terminal, and an other end of the second capacitive unit is connected to one that is not connected to the other end of the second resistive unit from among the second output terminal and the feedback signal output terminal.

11. The fully differential signal system of claim 10, wherein the first and second capacitive units are configured to reduce a value of a first frequency at which a first pole is formed and to increase value of a second frequency, which is greater than the value of the first frequency, at which a second pole is formed.

12. The fully differential signal system of claim 11, wherein the first and second resistive units are configured to compensate the second pole by forming a zero at a third frequency, which is greater than the value of the second frequency.

13. A fully differential signal system comprising:
a first amplification unit comprising first and second output terminals configured to output an output differential signal generated based on an input differential signal and a common mode feedback signal;
a common mode detection unit configured to detect a common mode signal included in the output differential signal;
a second amplification unit comprising a feedback signal output terminal configured to output the common mode feedback signal generated based on the detected common mode signal and a reference signal;
a first stabilization unit connected between the first output terminal and the feedback signal output terminal; and
a second stabilization unit connected between the second output terminal and the feedback signal output terminal,
wherein the first stabilization unit comprises a first resistor and a first capacitor that are connected in series between the first output terminal and the feedback signal output terminal.

* * * * *